(12) United States Patent
Talwalkar et al.

(10) Patent No.: US 9,076,366 B2
(45) Date of Patent: Jul. 7, 2015

(54) CLOCK RECOVERY SYSTEM

(75) Inventors: Niranjan Talwalkar, San Jose, CA (US); Moshe Malkin, Mountain View, CA (US)

(73) Assignee: Aquantia Corp., Milpitas, CA (US)

( * ) Notice: Subject to any disclaimer, the term of this patent is extended or adjusted under 35 U.S.C. 154(b) by 0 days.

(21) Appl. No.: 13/398,748

(22) Filed: Feb. 16, 2012

(65) Prior Publication Data
US 2013/0214829 A1 Aug. 22, 2013

(51) Int. Cl.
*H03D 3/24* (2006.01)
*G09G 5/00* (2006.01)
*H03L 1/00* (2006.01)
*H04B 17/00* (2015.01)

(52) U.S. Cl.
CPC . *G09G 5/008* (2013.01); *H03L 1/00* (2013.01); *H04B 17/00* (2013.01)

(58) Field of Classification Search
USPC .......................................... 375/376
See application file for complete search history.

(56) References Cited

U.S. PATENT DOCUMENTS

| | | | |
|---|---|---|---|
| 2005/0276322 A1* | 12/2005 | Best | 375/239 |
| 2007/0021084 A1* | 1/2007 | Wolf | 455/260 |
| 2008/0176523 A1* | 7/2008 | Sutton et al. | 455/76 |
| 2009/0318095 A1* | 12/2009 | Shu | 455/84 |
| 2010/0073095 A1* | 3/2010 | Hirano | 331/34 |
| 2010/0327853 A1* | 12/2010 | Machida et al. | 324/166 |
| 2012/0044983 A1* | 2/2012 | Kerr | 375/233 |
| 2012/0142283 A1* | 6/2012 | Taya | 455/76 |
| 2012/0249250 A1* | 10/2012 | Cheng et al. | 331/45 |
| 2012/0293235 A1* | 11/2012 | Nakamura | 327/360 |
| 2013/0039402 A1* | 2/2013 | Skarby et al. | 375/222 |
| 2013/0069696 A1* | 3/2013 | Koerner | 327/117 |

OTHER PUBLICATIONS

Savoj et al, "*A 10-Gb/s CMOS Clock and Data Recovery Circuit with a Half-Rate Linear Phase Detector*," IEEE Journal of Solid-State Circuits, vol. 36, No. 5, May 2001. pp. 761-768.

Kreienkamp et al, "*A 10-Gb/s CMOS Clock and Data Recovery Circuit With and Analog Phase Interpolator*," IEEE Journal of Solid-State Circuits, vol. 40, No. 3, Mar. 2005. pp. 736-743.

Rambus—Phase Interpolator Based CDR, http://www.rambus.com/in/technology/innovations/detail/phase_interpolator.html. downloaded on Jan. 6, 2012, 4 pages.

* cited by examiner

*Primary Examiner* — Tanmay Shah
(74) *Attorney, Agent, or Firm* — Lance M. Kreisman; Peninsula Patent Group

(57) ABSTRACT

In a first embodiment of the present invention, a clock recovery system is provided comprising: a phase comparator; an integrator coupled to the phase comparator; a numerically controlled oscillator coupled to the integrator; and a mixer coupled to the numerically controlled oscillator and to the phase comparator.

10 Claims, 12 Drawing Sheets

CLOCK RECOVERY SYSTEM

BACKGROUND OF THE INVENTION

1. Field of the Invention

The present invention relates generally to network communications. More specifically, the present invention relates to a clock recovery system.

2. Description of the Related Art

In electronics and especially synchronous digital circuits, a clock signal is a particular type of signal that oscillates between a high and a low state and is utilized like a metronome to coordinate actions of circuits. There are some instances, however, where a clock signal is not explicitly utilized. Some digital data streams, including, for example, high-speed data streams are sent without an accompanying clock signal. In such instances, the receiver must initiate some sort of clock recovery process to derive a clock signal from the data stream. This is because a serial data stream is merely a waveform representing a series of data symbols transmitted as sequential groups of symbols. The problem is that it is difficult to know at what instants it is best to sense or sample the signal. A clock signal must therefore be recovered from this sequential data. This process is commonly known as clock and data recovery (CDR).

Generally speaking, there are three current ways to perform CDR. The first is known as Phase-locked-loop-type (PLL-type). In PLL-type clock recovery, a control system generates an output signal whose phase is related to the phase of an input "reference" signal. The phase-locked-loop-type system includes a variable frequency oscillator, a filter and a phase detector. The phase of the input signal is compared with the phase of the signal derived from the output of the variable frequency oscillator and the system adjusts the frequency of the oscillator to keep the phases matched. The signal from the phase detector is used to control the oscillator in a feedback loop.

Frequency is the derivative of phase. Keeping the input and output phase in lock step implies keeping the input and output frequencies in lock step. Consequently, a phase-locked loop can track an input frequency, or it can generate a frequency that is a multiple of the input frequency.

FIG. 1 is a diagram of an exemplary PLL architecture. Included in the architecture are a phase detector 100, VCO 102, loop filter 104, and amplifier with gain K 106.

PLL-type clock recovery systems, however, have some drawbacks. First, they use a lot of power. In some circuits this is not an issue, but as power needs of circuits increase and size of circuits shrink, power usage becomes a larger concern. Additionally, PLL-type clock recovery systems require a lot of area. In the case of multiple receivers on the same chip, the architecture has a risk of coupling between voltage controlled oscillators (VCOs) which can result in clock jitter degradation.

The second way to perform CDR is to use a master clock to drive a phase interpolator. The phase interpolator generates multiple time-shifted phases of the master clock. Typically a PLL is used to implement a reference loop, which accepts an input reference clock signal and produces a set of high speed clock signals to be used as the reference phases. These references are then fed to a CDR loop that includes circuitry for continuously selecting reference phases and interpolating between them to provide clocks for recovering the data from the data signal. FIG. 2 is a diagram of an exemplary phase interpolator based CDR. Included in this clock recovery system is a reference loop 200 and a CDR loop 202. The CDR loop 202 includes a phase selector and interpolator 204, CDR loop control circuits 206, and samplers 208.

Unfortunately, in these types of systems, there are only a limited number of possible interpolated phases, leading to additional jitter degradation in the recovered clock. A further disadvantage of this scheme is that the output clock is always at the same frequency as the master clock. This means that there is always a steady state frequency mismatch in the received data and the recovered clock. This also means that, for the duration between control signal updates, the received clock is always accumulating phase error proportional to the integral of the frequency difference of the received data and the master clock.

The third way to perform CDR is to use an analog phase interpolator to generate a shifted clock using a control voltage as input. This scheme needs two voltages to be generated in response to the phase error, which are such that the sum of the squares of their amplitudes at all times is constant. FIG. 3 is a diagram of an exemplary data recovery circuit with analog phase interpolator. Here, both positive and negative transitions of the recovered clock are used for sampling. A preamplifier 300 is applied at the data input of the CDR to provide optimum common mode level for a phase detector 302 and to amplify the incoming data to increase the timing margin of the samplers. The phase of the recovered clock is adjusted in the phase interpolator core 304. Since the used binary phase detector samples the incoming data at its transition to derive the required phase information, two orthogonal, half-symbol shifted, clocks are provided by the PI core. The disadvantage here is that current implementations are analog in nature and hence tend to be approximations of what is really needed. Furthermore, despite the use of an analog PI, the phase adjustment of the recovered clock is not continuous. This is because the filter output changes in discrete steps.

SUMMARY OF THE INVENTION

In a first embodiment of the present invention, a clock recovery system is provided comprising: a phase comparator; a filter coupled to the phase comparator; a frequency synthesizer coupled to the filter; and a mixer coupled to the frequency synthesizer and to a master clock.

In a second embodiment of the present invention, a clock recovery system comprising: means for comparing a phase of an input signal; means for filtering an output of the means for comparing; means for generating an inphase and quadrature clock from an output of the means for filtering; means for mixing the inphase and quadrature clock from the means for generating with an inphase master clock and a quadrature master clock, and passing a resulting recovered clock to the means for comparing.

In a third embodiment of the present invention, a method for recovering a clock signal from an input stream is provided, comprising: generating a voltage by comparing the input stream to another input stream; generating an inphase clock signal and a quadrature clock signal from the voltage; mixing the inphase clock signal and the quadrature clock signal with an inphase master clock signal and a quadrature master clock signal, respectively, producing a recovered clock signal.

DETAILED DESCRIPTION OF SPECIFIC EMBODIMENTS

Reference will now be made in detail to specific embodiments of the invention, including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

The present invention utilizes a frequency synthesizer, such as a numerically controlled oscillator (NCO) or VCO in conjunction with a mixer to achieve a low-power small clock recovery section with the ability to lock to the received data with negligible steady-state frequency and phase error. It is able to generate in-phase and quadrature voltages continuously and accurately. This allows for a small area design (not possible with prior art PLL-type designs) with almost continuous control over phase and frequency (not possible with prior art PI-type designs).

An NCO is similar to a VCO, although whereas a VCO is an analog circuit, an NCO is digital. The output sinusoidal frequency is controlled by digital input value.

Figure 1:
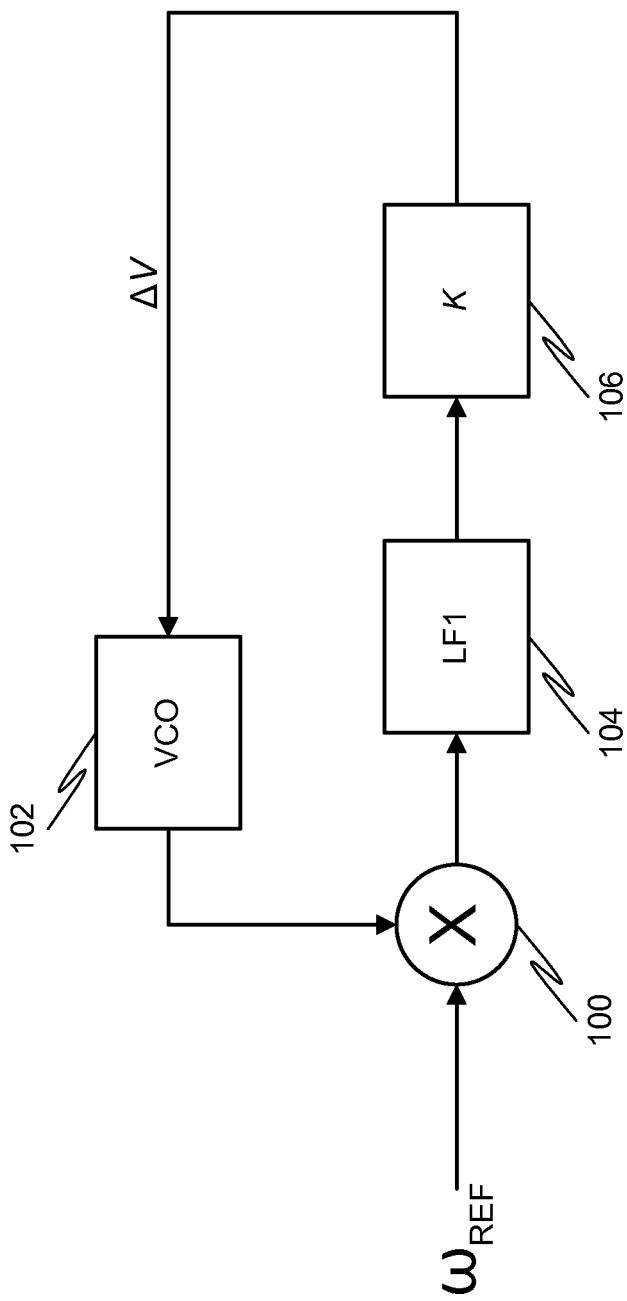
FIG. 1 is a diagram of an exemplary PLL architecture.
Figure 2:
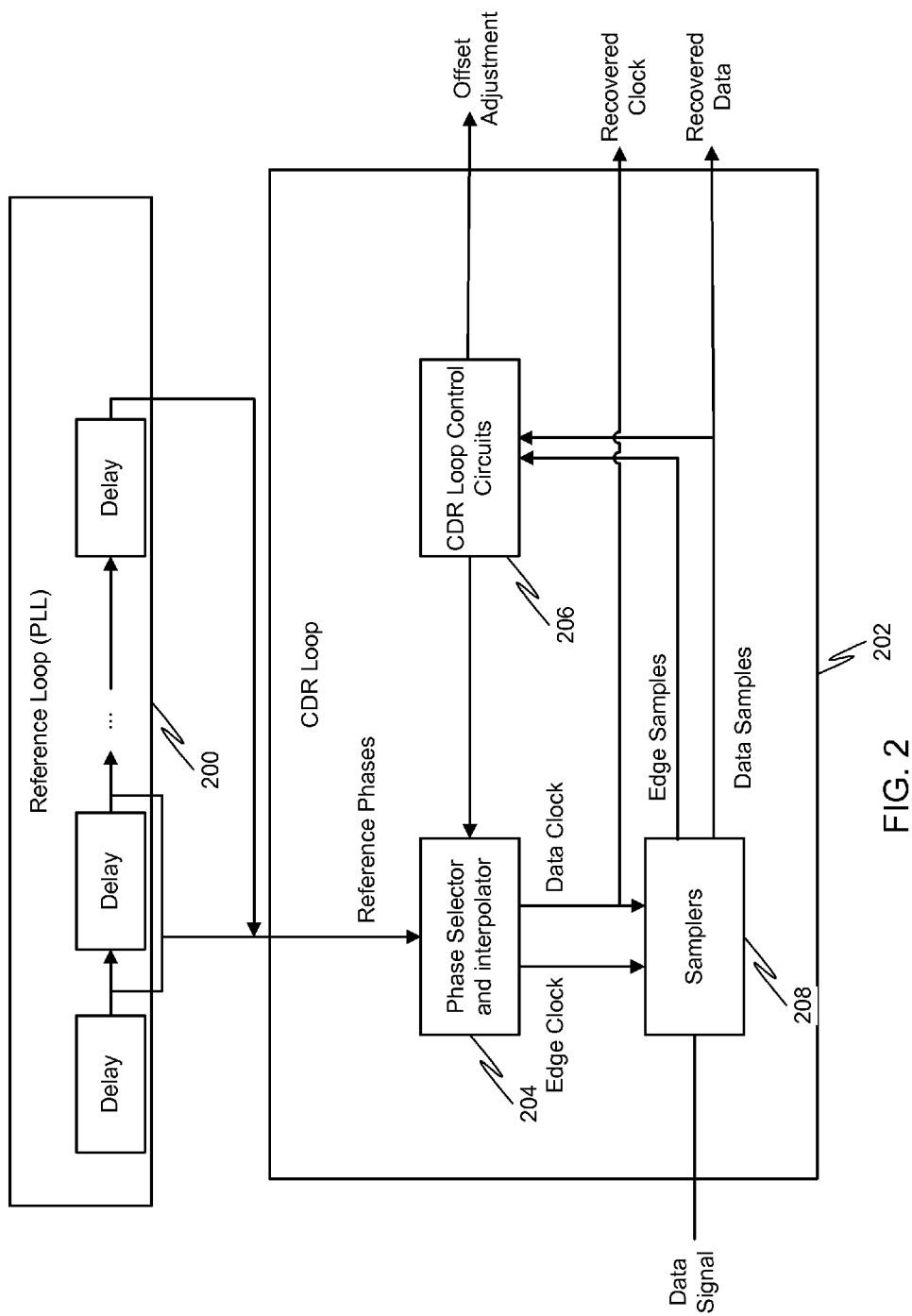
FIG. 2 is a diagram of an exemplary phase interpolator based CDR.
Figure 3:
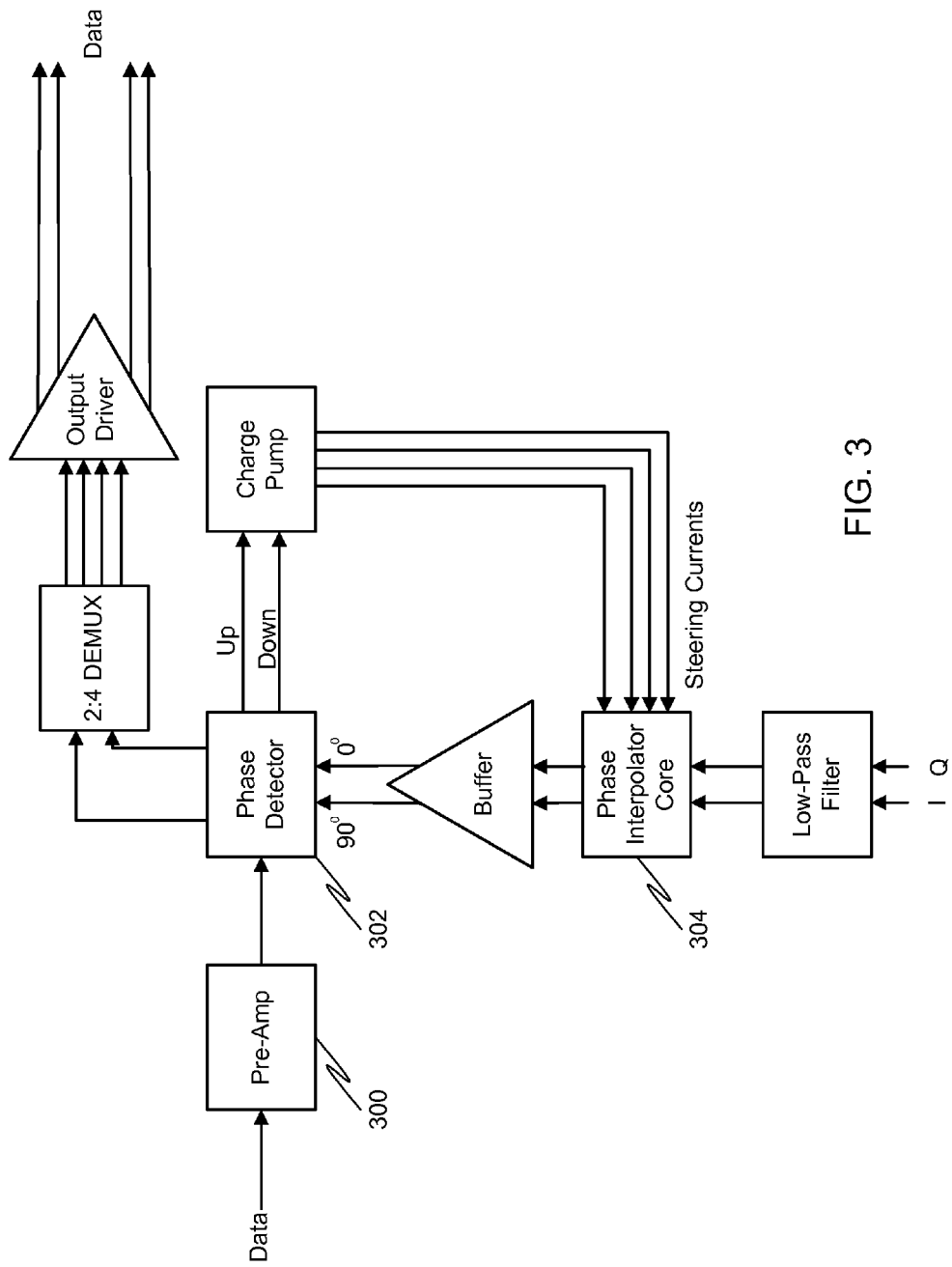
FIG. 3 is a diagram of an exemplary data recovery circuit with analog phase interpolator.
Figure 4:
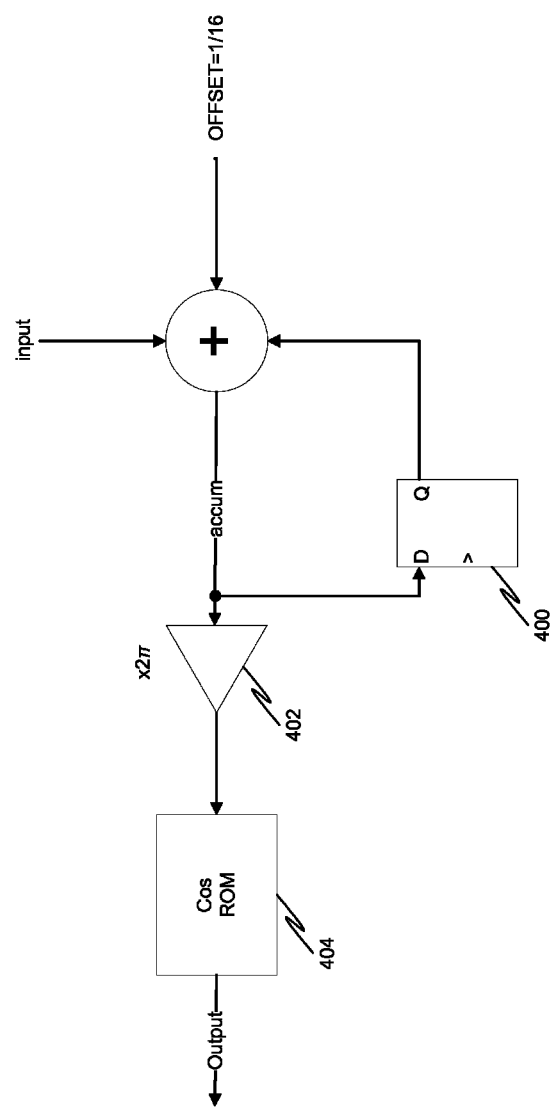
FIG. 4 is a diagram illustrating an example NCO that can be used in an embodiment of the present invention.

FIG. 4 is a diagram illustrating an example NCO that can be used in an embodiment of the present invention. It should be noted that this is merely an example, and that other NCO architectures are contemplated. If one assumes that the system clock frequency is 16 Mhz and the center NCO operating frequency is 1 Mhz, then there are 16 sampling points in one cycle of a 1 Mhz sinusoidal wave. The NCO then generates exactly one cycle of sinusoidal wave when the input value is zero. Then the offset value is 1/16. Every clock cycle, a D flipflop 400 accumulates the offset value. Then, in 16 cycles, the accumulated value will increase by 1.0. The accumulator output is then multiplied by 2Π in block 402. Then the cosine value is extracted from the cos ROM 404.

When the input value is more than 0, the accumulation speed gets higher. Then in less than 16 cycles, the accumulator increases by 1.0. This corresponds to higher frequency than 1.0 MHz is generated. Vice versa, when the input value is less than 0, lower frequency than 1.0 MHz is generated. Consequently, the NCO operating frequency will be controlled by the input value with center frequency of 1.0 MHz.

Figure 5:
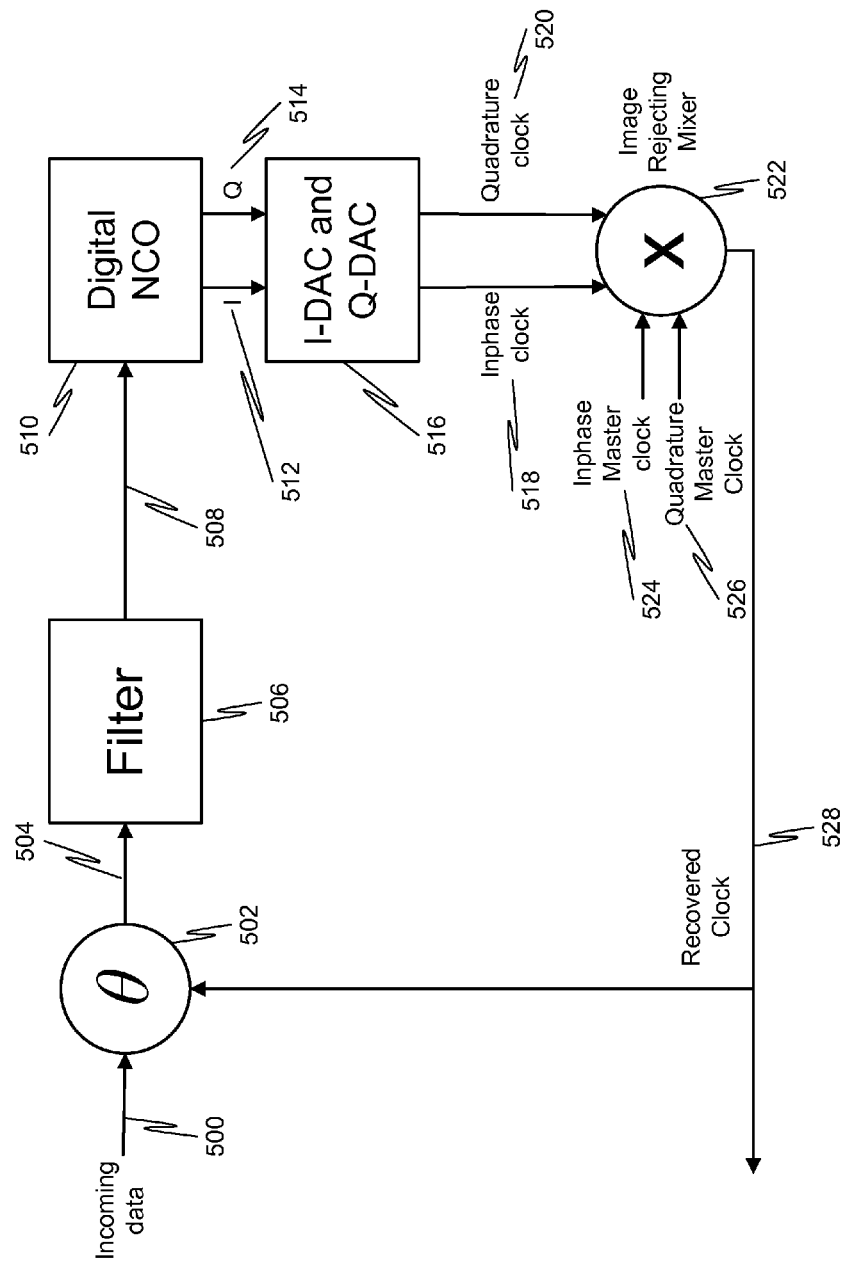
FIG. 5 is a general architecture diagram of an embodiment of the present invention.

As stated earlier, the NCO combined with a mixer allows the system to achieve a low-power small clock recovery section with the ability to lock to the received data with negligible steady-state frequency and phase error. FIG. 5 is a general architecture diagram of an embodiment of the present invention. Incoming data 500 is received by a phase comparator 502. Output 504 of the phase comparator 502 is passed to a filter 506, which may be, for example, an integrator. The filtering function could also encompass other control mechanisms, such as state-machine based controllers. The output 508 of the integrator 506 is passed to the NCO 510, which generates an inphase clock 512 and a quadrature clock 514. A Digital-to-Analog converter (DAC) 516 (which may comprise a separate DAC for each of the I and Q components) can convert the digital clock signatures generated by the NCO 510 to analog clock outputs 518 and 520. An image rejecting mixer 522 then mixes the inphase clock 518 and the quadrature clock 520 with the inphase master clock 524 and the inphase quadrature clock 526. The output 528 of this process is a recovered clock that can also be passed back to the phase comparator 502. The master clock could be a dedicated clock source for the proposed clock-recovery method or it could be shared among multiple applications or systems that all require a clock source. Many other embodiments are possible consistent with the claims set forth. For example, instead of utilizing incoming data, phase comparator 502 could receive as input a clock signal already extracted from the incoming data. Another possible embodiment is for the digital logic to run with a clock speed/frequency that is significantly lower than the recovered clock frequencies to result in efficient design. Furthermore, different elements of the described system could be run at different clock speeds, such as the phase comparator, filter, NCO & DAC, all possibly running at different clock speeds.

It should be noted that throughout this application, as in FIG. 5, the filter 506 is depicted as a separate component from the phase comparator 502. One of ordinary skill in the art will recognize, however, that in some embodiments these components may be combined into one. The claims shall be construed as covering such embodiments, even when the components are described using different terms.

There may be several different ways that mixing can occur. In one embodiment of the present invention, an image-rejecting mixer is used to mix the master clock and the NCO output to create a single-tone recovered clock. The control signal to program the NCO is generated by a phase detection scheme, such as Bang Bang PDs, Gardner, Mueller-Muller, linear PFDs, etc. When the recovered clock locks to the received data, the quadrature frequency generated is ideally exactly the difference between the quadrature master clock and the received data clock rate.

Figure 6:
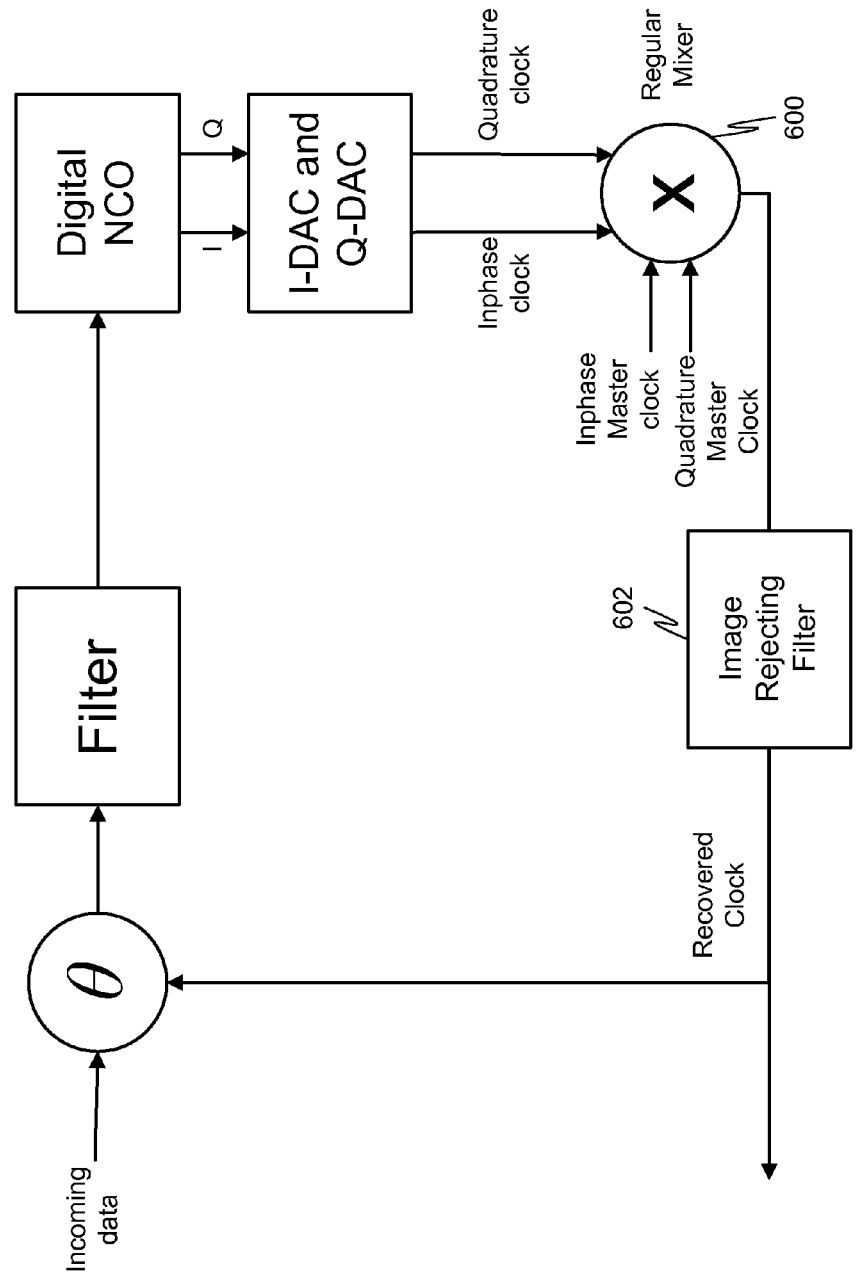
FIG. 6 is a general architecture diagram of another embodiment of the present invention.

In an another embodiment of the present invention, a non-image-rejecting mixer is used to mix the master clock and the NCO output to create a multi-tone output, which is then filtered to leave only one tone—the recovered clock. The control signal used to program the quadrature frequency is also generated by a phase detection scheme, such as Bang Bang PDs, Gardner, Mueller-Muller, linear PFDs, etc. This embodiment is depicted in FIG. 6, which is identical to FIG. 5 except for the fact that a regular mixer 600 is used with a separate imager rejecting filter 602. Other possible embodiments will have a filter that rejects most other undesired components from the clock at the mixer output but could leave some tones which would not significantly distort the clock recovery scheme or could be cancelled by other means such as, for example, digital processing in the phase comparator circuitry, etc.

Figure 7:
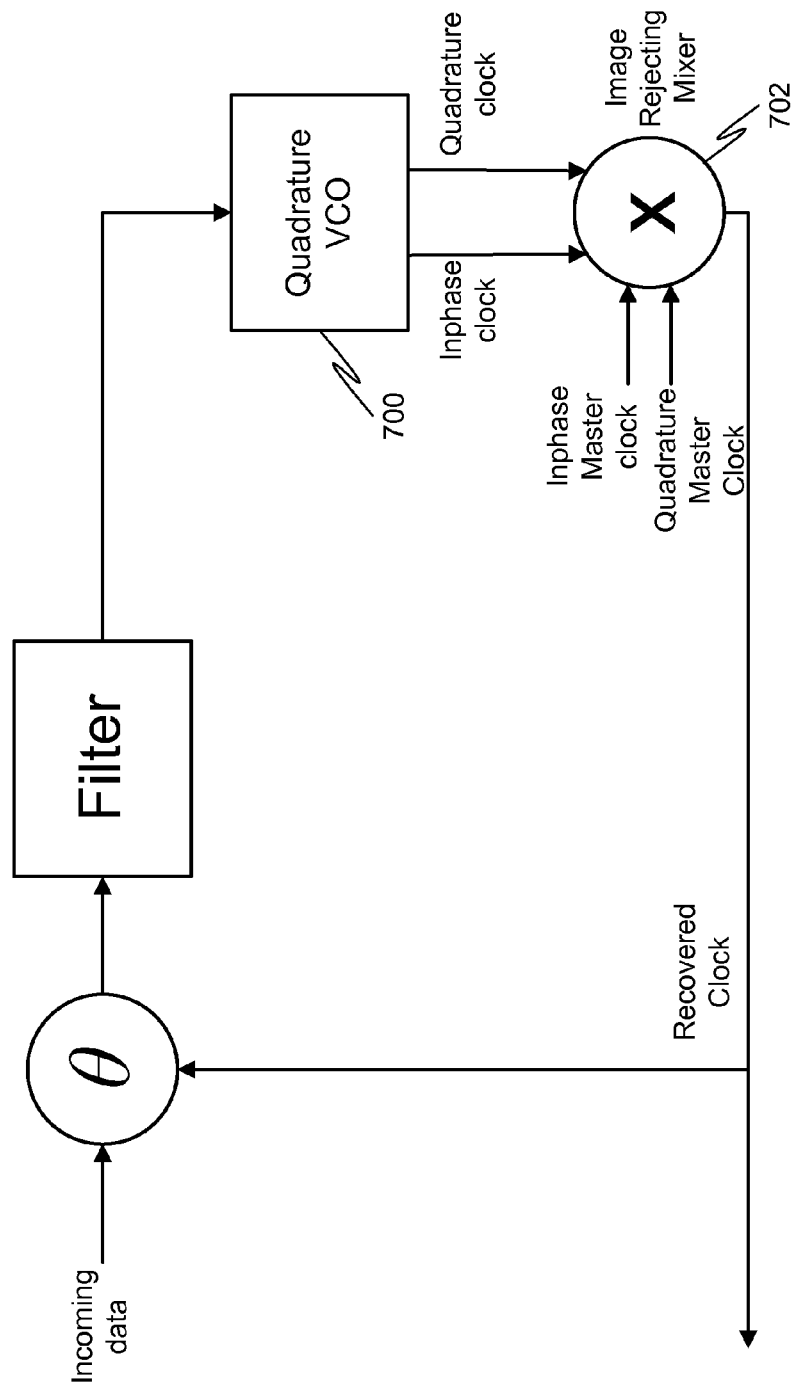
FIG. 7 is a general architecture diagram of another embodiment of the present invention.

FIG. 7 is a general architecture diagram of another embodiment of the present invention. Here, a Quadrature VCO 700 is used instead of an NCO. In light of this, there is no need for a DAC at the output of the VCO 700. Rather, the generated clock signals can be passed directly to an image rejecting mixer 702.

Figure 8:
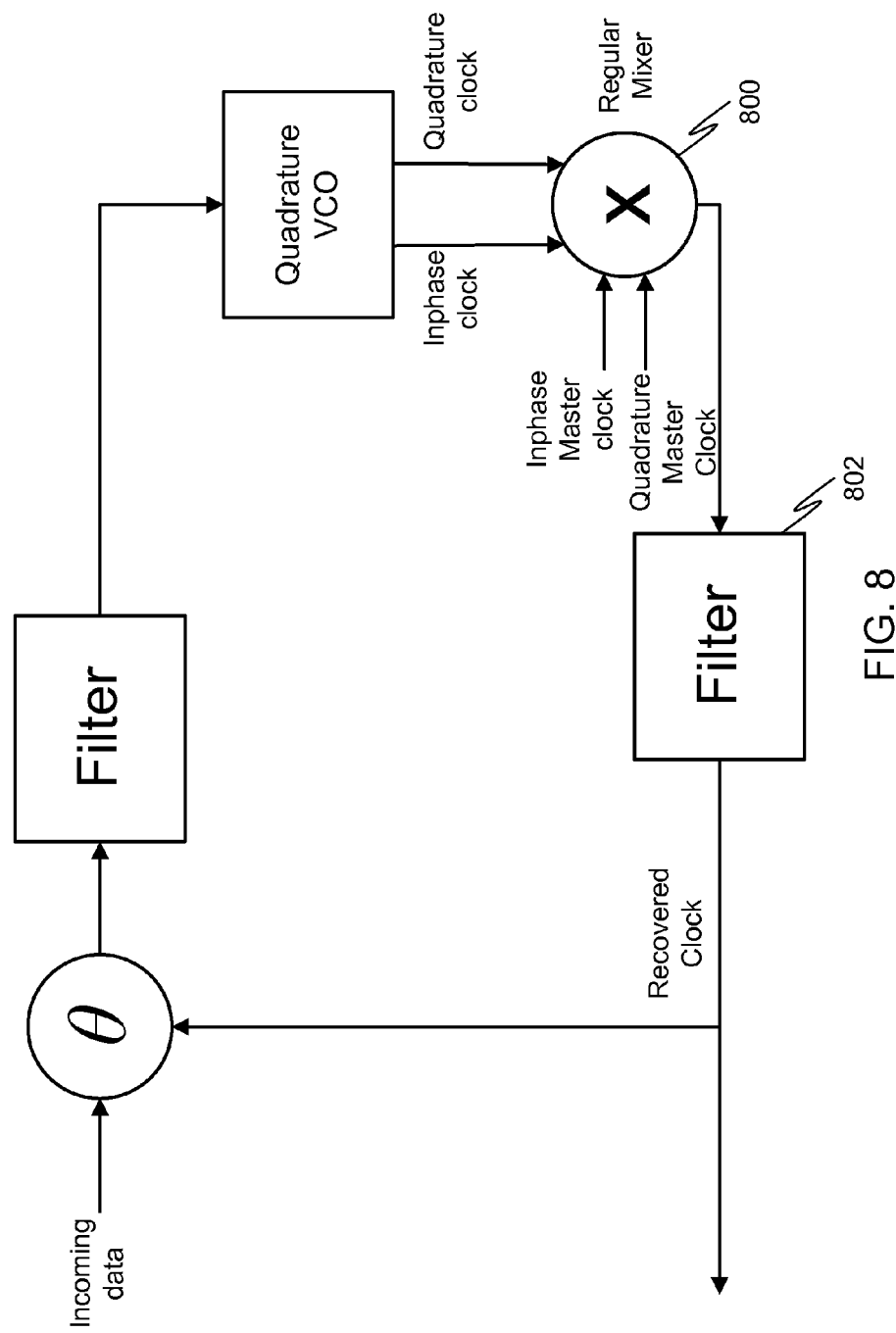
FIG. 8 is a general architecture diagram of another embodiment of the present invention.

Of course, the image rejecting mixer 702 in this embodiment could also be replaced by a regular mixer and a filter, as with in FIG. 6. This alternative embodiment is depicted in FIG. 8, with a regular mixer 800 and filter 802.

Figure 9:
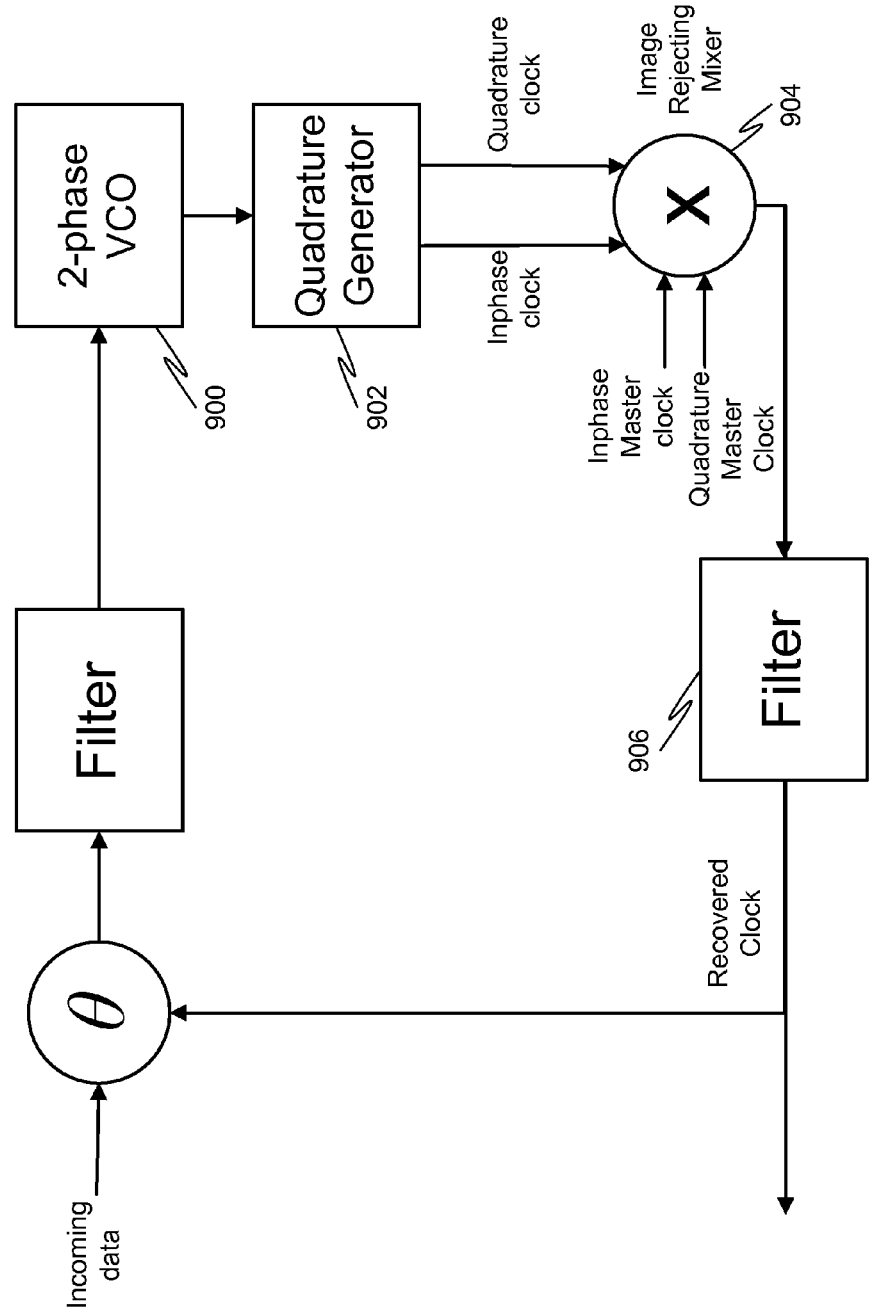
FIG. 9 is a general architecture diagram of another embodiment of the present invention.

FIG. 9 is a general architecture diagram of another embodiment of the present invention. Here, the clock signals are generated by a 2-phase VCO 900 and a separate quadrature generator 902. It should be noted that in this embodiment, despite the presence of an image rejecting mixer 904, a filter 906 is still used after the mixing. In real-world applications, hardware can create spurious unwanted mixer output products at 3 times the master clock, 5 times the master clock, etc. In order to get a single tone output, the output of the image rejecting mixer 904 can be further filtered.

Figure 10:
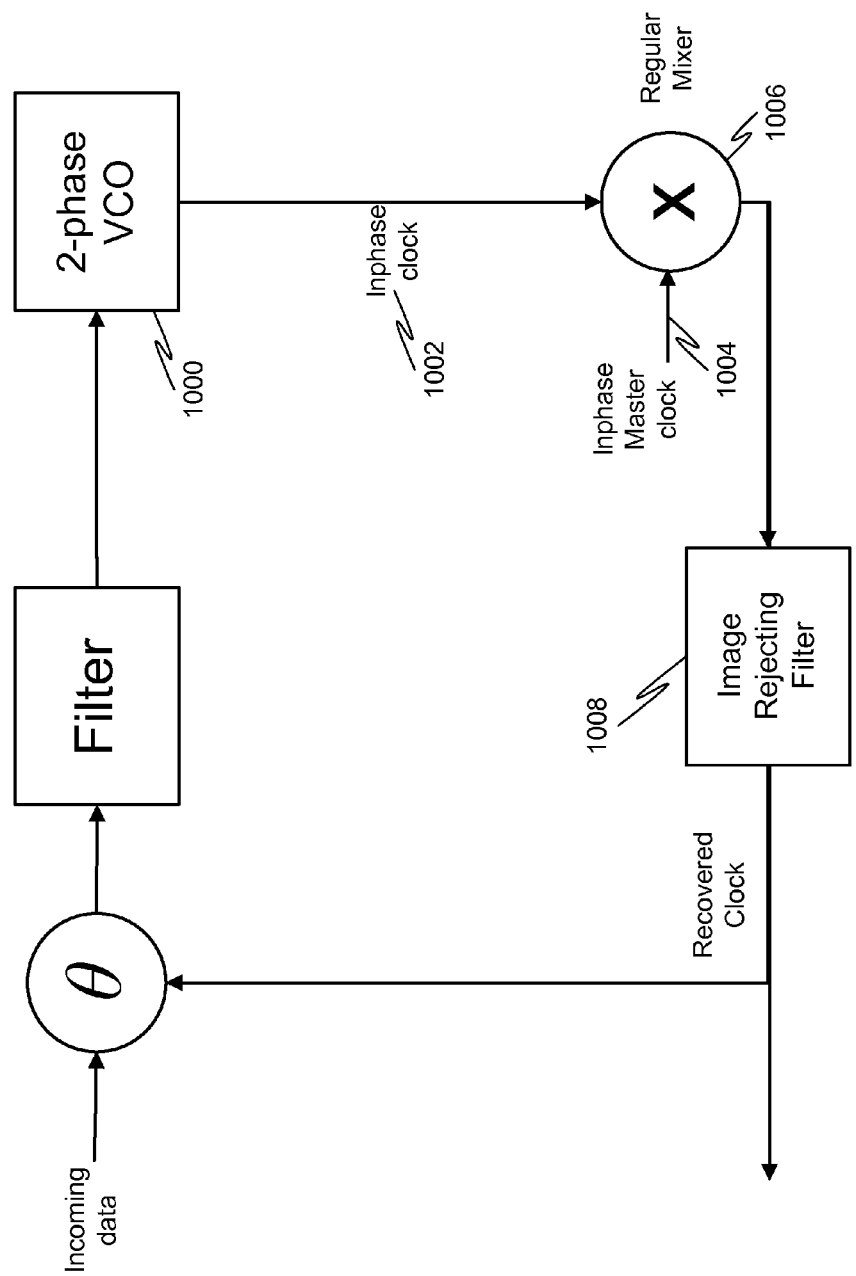
FIG. 10 is a general architecture diagram of another embodiment of the present invention.

FIG. 10 is a general architecture diagram of another embodiment of the present invention. Here, only an inphase clock is generated. A 2-phase VCO 1000 generates an inphase clock 1002, which is then mixed with an inphase master clock 1004 by mixer 1006. An image rejecting filter 1008 may be used, for example, if the mixer is a regular mixer (as in the depicted case).

Figure 11:
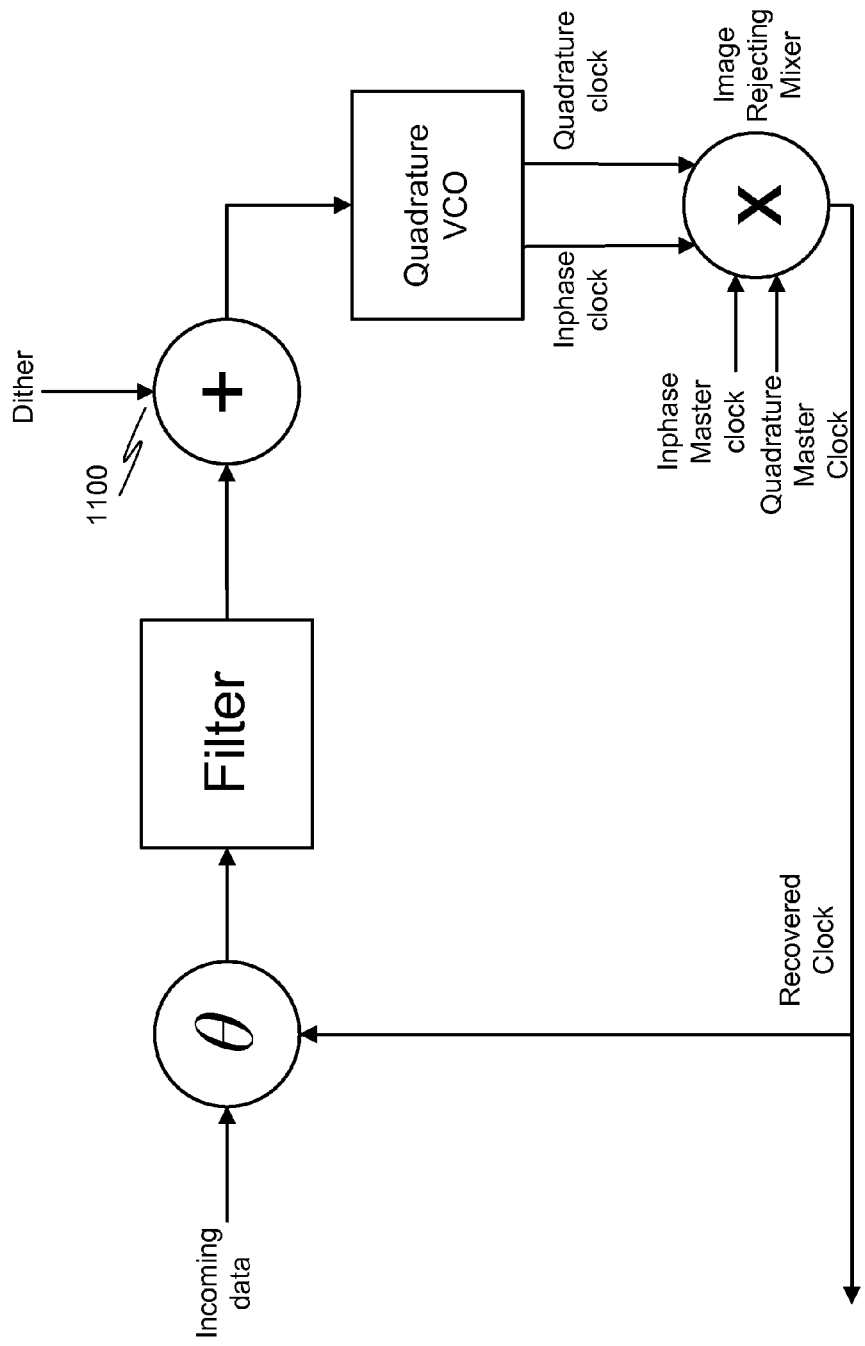
FIG. 11 is a general architecture diagram of another embodiment of the present invention.

FIG. 11 is a general architecture diagram of another embodiment of the present invention. This embodiment is similar to that in FIG. 7, except for the presence of a dither signal 1100 added to the input signal prior to the clock signal being generated. This dither function adds controlled noise to the input to randomize the quantization error. The dither signal can be added at VCO or NCO input when needed to improve the statistical error distribution of the NCO output to improve the system performance. The dither could also be added to the digital code words prior to the I-DAC or Q-DAC analog signal generation. The dither signal could be generated in many different ways, some deterministic and others random or pseudo-random to achieve the desired dither signal characteristics.

Figure 12:
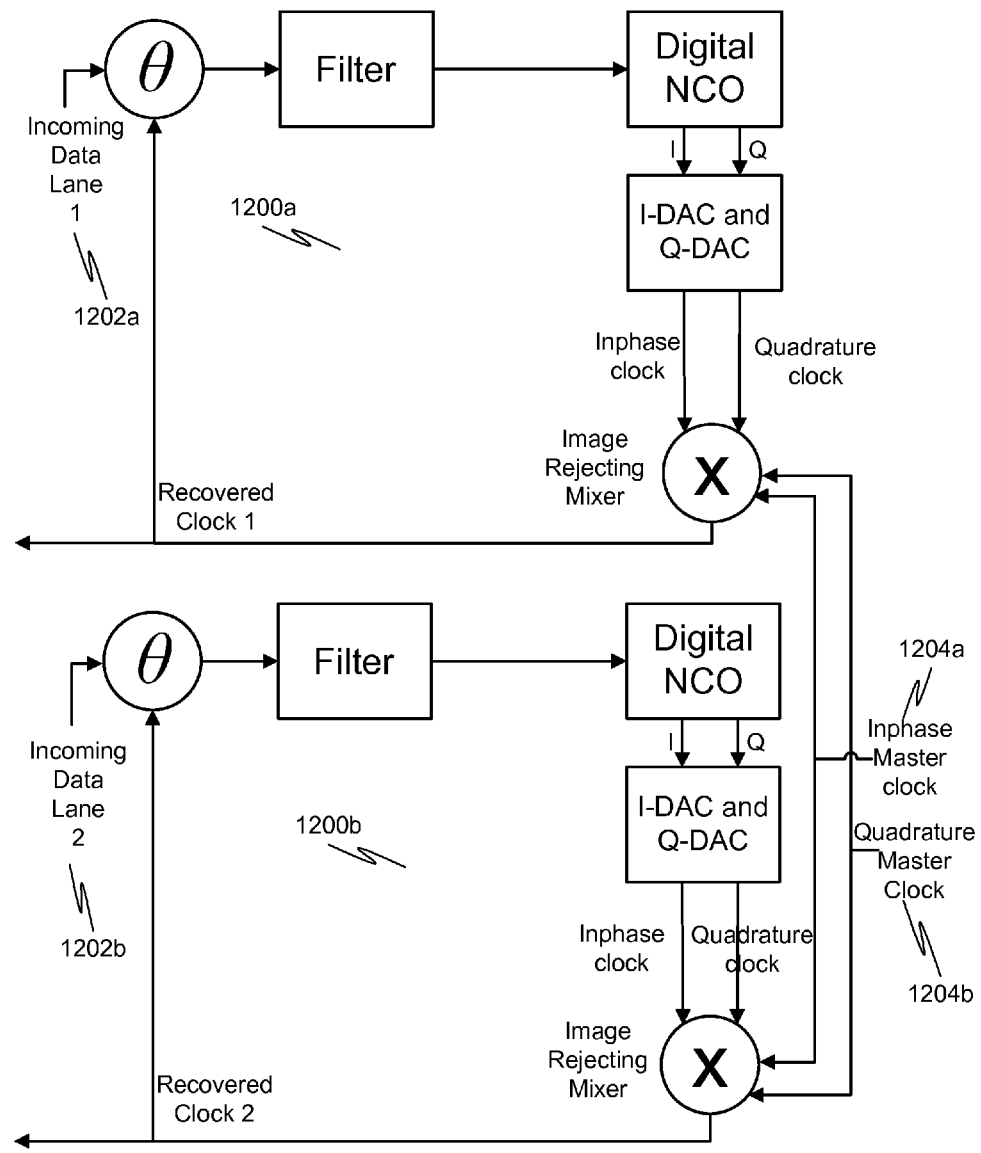
FIG. 12 is a general architecture diagram of a multi-lane embodiment in accordance with another embodiment of the present invention.

It should be noted that while one-lane implementations are depicted, the present invention can be applied to one-lane or multi-lane receivers in serial data systems, e.g., 10GBaseT, PCI, KR, etc. Moreover, the present invention is not limited to serial data systems but could be applied to other single/multi-lane/-link communication systems such as, for example, other wireline systems, wireless systems, optical systems, etc. FIG. 12 is a general architecture diagram of a multi-lane embodiment in accordance with another embodiment of the present invention. This embodiment extends the embodiment of FIG. 5 into two lanes, although one of ordinary skill in the art will recognize that any of the disclosed architectures could be extended into multiple lanes in a similar manner. Furthermore, while two lanes are depicted, one of ordinary skill in the art will recognize that similar modifications can be made to support any number of different lanes.

Essentially, in FIG. 12 there are two clock recovery systems 1200a, 1200b. Each of the two clock recovery systems 1200a, 1200b receives its own incoming data lane 1202a, 1202b. However, the two clock recovery systems 1200a, 1200b share the master clocks 1204a, 1204b.

In other embodiments, the clock recovery system could also function to recover clocks in other communication systems, such as optical transceivers, wireless, etc. The recovery of clocks can be used for a variety of purposes. In one example embodiment, clock recovery is used to recover data from a data path.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is defined as any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A low-power clock recovery system comprising:
plural clock recovery circuits that are for coupling to plural wired data lanes, the plural wired data lanes to provide plural data streams, the plural clock recovery circuits to recover a clock from each of the data streams, each clock recovery circuit including
a phase comparator receiving an incoming signal from one of the plural data streams from which a clock signal is to be derived, the incoming signal to be compared to a mixed clock signal;
a filter coupled to an output of the phase comparator;
a frequency synthesizer coupled to an output of the filter, wherein the frequency synthesizer comprises a numerically controlled oscillator to generate respective in-phase and quadrature-phase digital clock signatures;

a digital-to-analog converter (DAC) to receive the in-phase and quadrature-phase clock signatures, and to generate respective analog in-phase and quadrature-phase clock signals; and an image rejecting mixer to mix the analog in-phase and quadrature-phase clock signals with respective in-phase and quadrature-phase master clock signals to generate the mixed clock signal, the mixed clock signal fed back as a single-tone input signal to the phase comparator.

2. The clock recovery system of claim 1, wherein the frequency synthesizer is designed to receive a control signal generated by a bang-bang phase detection scheme.

3. The clock recovery system of claim 1, wherein the frequency synthesizer is designed to receive a control signal generated by a Mueller-Muller phase-detection scheme.

4. The clock recovery system of claim 1, wherein the frequency synthesizer is designed to receive a control signal generated by a linear phase-frequency detection scheme.

5. The clock recovery system of claim 1, wherein a dithering signal generator is coupled between an integrator and the frequency synthesizer.

6. The clock recovery system of claim 1, wherein the filter can be of any order.

7. A low-power clock recovery system comprising:
plural clock recovery circuits that are for coupling to plural wired data lanes, the plural wired data lanes to provide plural data streams, the plural clock recovery circuits to recover a clock from each of the data streams, each clock recovery circuit including a phase comparator receiving an incoming signal from one of the plural data streams containing clock information, the incoming signal to be compared to a mixed clock signal;

a filter coupled to an output of the phase comparator;

a frequency synthesizer coupled to an output of the filter to generate in-phase clock and quadrature clock signatures;

a digital-to-analog converter (DAC) to receive the in-phase and quadrature-phase clock signatures, and to generate respective analog in-phase and quadrature-phase clock signals;

a mixer to mix the analog in-phase clock output and the analog quadrature clock output of the frequency synthesizer with an in-phase master clock signal and a quadrature master clock signal to generate the mixed clock signal, the mixed clock signal fed back as a single-tone input to the phase comparator; and wherein the frequency synthesizer is a numerically controlled oscillator (NCO).

8. The clock recovery system of claim 7, wherein the mixer is an image rejecting mixer mixing the in-phase clock and the quadrature clock with an in-phase master clock and a quadrature master clock.

9. The clock recovery system of claim 7, wherein the clock recovery system further includes an image rejecting filter coupled to the output of the filter.

10. The clock recovery system of claim 7, wherein a dithering signal generator is coupled between the filter and the frequency synthesizer.

* * * * *